(12) United States Patent
Giske et al.

(10) Patent No.: US 11,630,125 B2
(45) Date of Patent: Apr. 18, 2023

(54) ADAPTER DEVICE, HOLDING CLAMP, AND METHOD FOR POSITIONING A CONDUCTOR PAIR OF A CABLE TO BE MEASURED

(71) Applicant: LEONI KABEL GMBH, Nuremberg (DE)

(72) Inventors: Nikolaj Giske, Friesoythe (DE); Kim-Thorben Bulik, Belm (DE); Bernd Janssen, Friesoythe (DE)

(73) Assignee: BizLink Industry Germany GmbH

( * ) Notice: Subject to any disclaimer, the term of this patent is extended or adjusted under 35 U.S.C. 154(b) by 910 days.

(21) Appl. No.: 16/473,661

(22) PCT Filed: Oct. 4, 2017

(86) PCT No.: PCT/EP2017/075179
§ 371 (c)(1),
(2) Date: Jun. 26, 2019

(87) PCT Pub. No.: WO2018/121895
PCT Pub. Date: Jul. 5, 2018

(65) Prior Publication Data
US 2019/0346481 A1 Nov. 14, 2019

(30) Foreign Application Priority Data
Dec. 28, 2016 (DE) ...................... 10 2016 226 261.0

(51) Int. Cl.
*G01R 1/04* (2006.01)
*H02G 1/12* (2006.01)
(Continued)

(52) U.S. Cl.
CPC ........... *G01R 1/0408* (2013.01); *G01R 31/58* (2020.01); *H02G 1/00* (2013.01); *H02G 1/127* (2013.01); *H02G 1/1212* (2013.01)

(58) Field of Classification Search
CPC ........ G01R 1/0408; G01R 31/58; H02G 1/00; H02G 1/1212; H02G 1/127; H02G 1/1204;
(Continued)

(56) References Cited

U.S. PATENT DOCUMENTS 3,462,682 A 8/1969 Barnett et al.
3,913,425 A * 10/1975 Iff ........................ H02G 1/1212
81/9.43
(Continued)

FOREIGN PATENT DOCUMENTS

CN 201106572 8/2008
CN 201349732 11/2009
(Continued)

OTHER PUBLICATIONS

Chinese Patent Office, Office Action for CN Application 201780085925.2, dated Feb. 3, 2020.
(Continued)

*Primary Examiner* — Phong H Nguyen
(74) *Attorney, Agent, or Firm* — Williams Mullen; Thomas F. Bergert

(57) ABSTRACT

The invention relates to an adapter device (10, 110, 210) for positioning at least one conductor (68), such as a conductor pair, for example, of a cable (70) to be measured, which adapter device comprises a receiving device (12) and a holding clamp (14) which can be attached to the receiving device (12). Attaching the holding clamp (14) to the receiving device (12) fixes the holding clamp (14) in position and alignment relative to the receiving device (12). The holding clamp (14) is designed to receive and clamp the at least one conductor (68) of the cable (70) to be measured in sections in order to fix said cable in the position and alignment thereof relative to the holding clamp (14), such that an end
(Continued)

section of the at least one conductor (68) extends beyond the holding clamp (14).

6 Claims, 9 Drawing Sheets

(51) Int. Cl.
*G01R 31/58* (2020.01)
*H02G 1/00* (2006.01)

(58) Field of Classification Search
CPC .. H02G 1/1207; H02G 1/1209; H02G 1/1248; H02G 1/1251; H02G 1/1253; H02G 1/1256
USPC ............................ 81/94, 9.4, 9.51, 9.41, 9.42
See application file for complete search history.

(56) References Cited

U.S. PATENT DOCUMENTS

| | | | |
|---|---|---|---|
| 4,647,844 A | 3/1987 | Biegon et al. | |
| 4,961,357 A | 10/1990 | Butler et al. | |
| 5,138,910 A * | 8/1992 | Ishikawa | H02G 1/1256 29/33 M |
| 6,311,581 B1 * | 11/2001 | Hsieh | G02B 6/245 81/9.41 |
| 6,330,839 B1 | 12/2001 | Amrein | |
| 6,823,761 B2 * | 11/2004 | Chiang | G02B 6/245 81/9.41 |
| 9,337,552 B2 * | 5/2016 | Witte | F21V 21/002 |
| 2005/0050713 A1 | 3/2005 | Locher et al. | |
| 2014/0290049 A1 | 10/2014 | Lussier | |
| 2015/0207241 A1 | 7/2015 | Witte et al. | |

FOREIGN PATENT DOCUMENTS

| | | |
|---|---|---|
| CN | 104583782 | 4/2015 |
| DE | 19512947 | 5/1996 |
| EP | 0989637 | 3/2000 |
| EP | 1012613 | 4/2002 |
| EP | 2703826 | 3/2014 |
| EP | 2885645 | 6/2016 |

OTHER PUBLICATIONS

International Search Report and Written Opinion of the International Searching Authority for PCT/EP2017/075179, European Patent Office, dated Dec. 28, 2016.

European Patent Office, European Examination Report for EP Patent Application No. 17 788 126.5, dated Feb. 7, 2023.

* cited by examiner

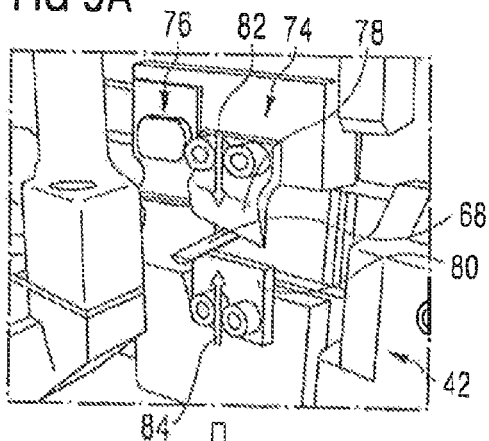
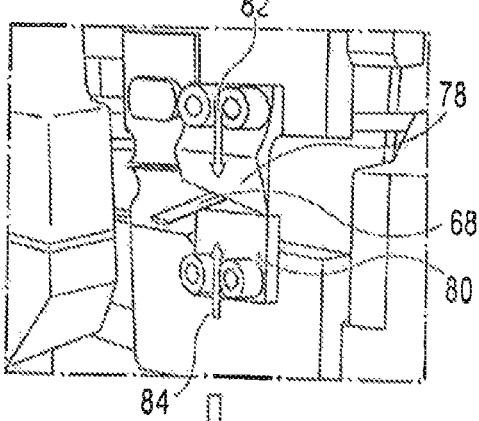
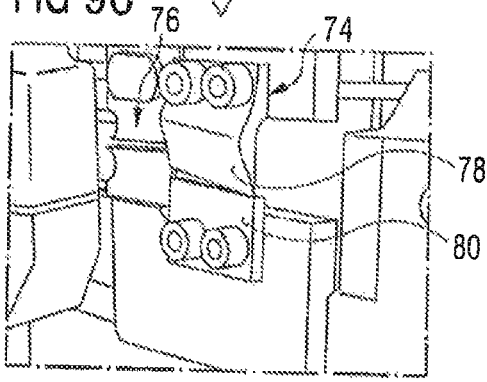

ADAPTER DEVICE, HOLDING CLAMP, AND METHOD FOR POSITIONING A CONDUCTOR PAIR OF A CABLE TO BE MEASURED

CROSS-REFERENCE TO RELATED APPLICATIONS

This application is the U.S. national phase of international application PCT/EP2017/075179, filed on Oct. 4, 2017, which claims the benefit of German application DE 10 2016 226 261.0 filed on Dec. 28, 2016; all of which are hereby incorporated herein in their entirety by reference.

The present disclosure relates to an adapter device, a holding clamp, and a method for positioning a conductor, for example a conductor pair, of a cable to be measured.

In the measuring of cables, such as, for example, high-speed cables for transmitting signals in the range of up to 50 GHz, specimen preparation of a cable to be measured is frequently associated with a high manual outlay and therefore takes a comparatively long time. Before a measurement can be carried out, it is necessary, for example, to remove the insulation from part of the conductors of the cable that are to be measured. The length of the stripped portions of the conductors may also have to be adjusted in order to ensure optimal contacting with a circuit board which can be connected to a measuring instrument. Furthermore, the prepared conductors must be positioned on the circuit board and fixed thereto. The expensive measuring instrument can in most cases not be used during specimen preparation.

In practice, specimen preparation is conventionally carried out manually by hand. However, this leads to relatively great differences between different measurements and therefore has negative effects on the reproducibility of measurement results. On the one hand, manual preparation means that the different specimens, or the prepared cables that are to be measured, differ from one another, for example in respect of the length of the stripped portion of the conductor. On the other hand, contacting of the conductor to be measured with the circuit board, for example, varies between different measurements.

It is an object of the present invention to simplify the measurement of a conductor of a cable and to improve the reproducibility of cable measurements.

This object is achieved by an adapter device having the features of claim 1, a holding clamp having the features of claim 8, and a method having the features of claim 15.

Further embodiments will become apparent from dependent claims 2 to 7, 9 to 14 and 16, as well as from the following description.

According to a first aspect there is provided an adapter device for positioning at least one conductor, for example a conductor pair, of a cable to be measured. This adapter device comprises a receiving device and a holding clamp which can be attached to the receiving device, wherein attaching the holding clamp to the receiving device fixes the holding clamp in its position and orientation relative to the receiving device. The holding clamp is configured to receive and clamp part of the at least one conductor of the cable to be measured, in order to fix the conductor in its position and orientation relative to the holding clamp, so that an end portion of the at least one conductor extends beyond the holding clamp.

In other words, the adapter device serves for specimen preparation of at least one conductor or of at least one conductor pair of a cable to be measured, in that the position and orientation of the conductor or conductor pair can be fixed by means of the adapter device in a predetermined manner and thus reproducibly. While the holding clamp can be fixedly or removably attached to the receiving device, the receiving device can be capable of being mounted or can be mounted stationarily, for example, on a support, a frame or a further component of the adapter device. Since the at least one conductor received and clamped by means of the holding clamp is also fixed relative to the receiving device by the attachment of the holding clamp to the receiving device, its position relative to further components of the adapter device and/or further devices which can be connected to the adapter device can also be fixed at the same time.

The holding clamp can, for example, be capable of being releasably attached to the receiving device. Alternatively, the holding clamp can be capable of being fixedly attached to the receiving device. The holding clamp can thus be fastened to the receiving device via a rail system, for example, and be movable relative to the receiving device via this rail system.

In one exemplary embodiment, the holding clamp can be capable of being attached to the receiving device, wherein the receiving device can be displaceably fastened to the support via a rail system.

The receiving device and the holding clamp of the adapter device can have a mutually complementary shape at least in part, in order to attach the holding clamp to the receiving device in an interlocking manner. It can also be provided, for example, that the holding clamp and the receiving device form a releasable snap-in connection with one another by the attachment of the holding clamp to the receiving device. Alternatively or in addition to an interlocking connection of the holding clamp to the receiving device, means can be provided on the holding clamp and/or the receiving device for connecting the holding clamp to the receiving device by a force-based connection.

In one embodiment, the receiving device can have a receiving body with a receiving recess through which the holding clamp extends in a state in which it is attached to the receiving device, so that the holding clamp projects beyond the receiving body on opposite sides of the receiving body.

The receiving recess of the receiving device can have an inner circumference which can be brought into engagement at least in part with an outer circumference of the holding clamp. In this case, the inner circumferential surface of the receiving recess and the outer circumferential surface of the holding clamp can be formed to be complementary to one another at least in part. The cross-sectional opening formed by the inner circumference of the receiving recess and the cross-section of the holding clamp can be of rectangular shape, for example. In a mounted state, the inner circumferential surface of the receiving recess can enclose the outer circumferential surface of the holding clamp partially or completely.

In a further development, the adapter device can comprise a cutting and stripping device which can be connected or is connected to the receiving device. The cutting and stripping device can have a cutting tool which is configured to cut the end portion, extending beyond the holding clamp, of the at least one conductor received and clamped by the holding clamp to a predetermined length. Alternatively or in addition, the cutting and stripping device can have a stripping tool which is configured to strip a predetermined region of the end portion, extending beyond the holding clamp, of the at least one conductor received and clamped by the holding clamp.

The position of the cutting and stripping device relative to the receiving device can be fixed in that they are configured to be fixable to one another or in that the receiving device is integrated into the cutting and stripping device. The receiving device can be displaceably mounted on the cutting and stripping device and be capable of being fixed in different positions relative to the cutting and stripping device. In the case of a receiving device integrated into the cutting and stripping device, which receiving device is not displaceable relative to the cutting and stripping device, the holding clamp can also be displaceable in the receiving device and capable of being attached thereto, that is to say fixed relative thereto, in different positions. In the last-mentioned exemplary embodiment, the holding clamp is considered to be attached to the receiving device only when it is fixed relative thereto and its position and orientation relative thereto are accordingly fixed. The at least one conductor positioned by means of the holding clamp and the receiving device can thus at the same time be oriented and fixed in its position and orientation relative to the cutting and stripping device in the different embodiments.

The cutting and stripping device can be operable automatically and can thus automatically strip the end portion, extending beyond the holding clamp, of the at least one conductor in a predetermined region and/or cut the end portion, more precisely the stripped region of the end portion, to a predetermined length. Cutting and stripping can be carried out in any desired order. As a result, the entire length of the end portion, that is to say the length of the at least one conductor extending beyond the holding clamp, the length of the stripped region of the end portion and the length of the still insulated region of the end portion can be prepared precisely. Accordingly, reproducible specimen preparation can be ensured as a result of the fixed positioning of the at least one conductor and the automatic cutting and stripping.

In one embodiment, the adapter device can comprise a measuring adapter which can be connected to a measuring instrument and which has a circuit board having a contact region for contacting the end portion of the at least one conductor, and a displaceable plunger. The displaceable plunger can be configured, as a result of being actuated, to press the end portion of the at least one conductor onto the contact region of the circuit board. The displaceable plunger can be actuatable automatically, for example. The position of a base of the measuring adapter relative to the receiving device can be fixed. The at least one conductor positioned by means of the holding clamp and the receiving device can thus at the same time be fixed in terms of its position and orientation relative to the base of the measuring adapter.

The measuring adapter can comprise an X-Y table, wherein the circuit board of the measuring adapter can be mounted on the X-Y table with micrometer screws. The position of the circuit board relative to the end portion of the at least one conductor can thereby be adjustable by adjustment of the micrometer screws. A holding device of the plunger can be fixed in its position relative to the circuit board, so that the plunger is displaceable together with the circuit board by adjustment of the micrometer screws. Since the position of the at least one conductor, or of the end portion thereof, is fixed relative to the measuring adapter by means of the holding clamp and the receiving device and the position of the circuit board relative to the end portion of the at least one conductor can be adjusted precisely, reproducible contacting between the stripped region of the end portion of the at least one conductor and the circuit board can be achieved.

According to one embodiment, the adapter device can comprise a further receiving device and a further holding clamp which can be attached to the further receiving device. The further receiving device and the further holding clamp can have the same features as the receiving device and holding clamp described above. In this embodiment, one end of the cable to be measured can be positioned by means of the receiving device and the holding clamp, while the other end of the cable to be measured is positioned by means of the further receiving device and the further holding clamp.

A further aspect relates to a holding clamp for positioning at least one conductor, for example a conductor pair, of a cable to be measured, which holding clamp is configured to receive and clamp part of the at least one conductor of the cable to be measured in order to fix the conductor in its position and orientation relative to the holding clamp, so that an end portion of the at least one conductor extends beyond the holding clamp.

In other words, the holding clamp serves for specimen preparation of at least one conductor or at least one conductor pair of a cable to be measured, in that the position and orientation of the conductor or conductor pair can be fixed by means of the holding clamp in a predetermined manner and thus reproducibly. To that end, the holding clamp can be capable of being attached to a receiving device, for example a receiving device of the type described above, in such a manner that it is removable and can be fixed in its position and orientation.

In one embodiment, the holding clamp can have an elongate base body which comprises a first leg and a second leg which extend substantially parallel to one another along a longitudinal axis of the holding clamp and are spaced apart from one another in order to receive at least part of the at least one conductor between the first and the second leg. To that end, the legs can have, for example, a groove on a surface facing the respective other leg, which groove extends in the longitudinal direction of the holding clamp and is configured to receive a portion of the at least one conductor with or without associated insulation.

The first leg and the second leg can be displaceable relative to one another at least in part, at least slightly. Each of the two legs can have a spring bias which counteracts a displacement of the respective leg. The first and/or the second leg can have a projection which extends in the direction towards the respective other leg and is configured to act on the at least one conductor in order to clamp it between the projection and the respective other leg. The projection can be formed, for example, on the surface of the first and/or second leg that has the groove. If a force is applied to the first and second legs which moves the legs towards one another or presses them together, the at least one conductor arranged between them can be firmly clamped in the holding clamp by the surfaces facing one another and by the projection or projections.

The dimensions and geometries of the legs, and also the distance provided between them, can be so chosen that the holding clamp can be used with different cables and conductors of different geometries and dimensions. Alternatively, the dimensions and geometries of the legs, and also the distance provided between them, of the holding clamp can be chosen to receive and clamp one or more specific product designs. The holding clamp is thus reusable for a large number of measurements.

In a further development of the holding clamp, the first leg and the second leg can be connected together, for example pivotably, at one end of the holding clamp, wherein the holding clamp comprises at that end an insertion opening for insertion of the at least one conductor. The holding clamp can be in one piece, for example, or comprise first and second legs formed separately from one another.

In one embodiment, the holding clamp can comprise a force application mechanism which is configured to act on the first and/or the second leg in order to clamp the at least one conductor firmly between the first and the second leg. For example, the force application mechanism can apply a force to the first and the second leg that moves the legs towards one another or pushes them together in order firmly to clamp the at least one conductor arranged between them. To that end, the force application mechanism can be manually or automatically adjustable.

The force application mechanism can comprise, for example, a substantially U-shaped stirrup with two mutually parallel stirrup legs and a stirrup crosspiece connecting the stirrup legs, wherein the stirrup legs are each fixedly or pivotably connected to the second leg of the holding clamp and the first leg of the holding clamp is arranged between the stirrup crosspiece and the second leg. The stirrup crosspiece can have a threaded bore into which a screw can be screwed in order to act in a force-applying manner on the first leg of the holding clamp.

The base body of the holding clamp can be capable of being produced by means of a rapid prototyping method, for example by means of a 3D printing method. The base body can be formed of plastics material, while the force application mechanism can be made of metallic material.

The holding clamp can be capable of being attached to the receiving device in such a ic manner that it can be removed comparatively simply. This allows the holding clamp to be used with different measuring adapters, measuring instruments and/or conductors, whereby rapid and reproducible contacting of the at least one conductor with a circuit board can be achieved and thus measurement can be carried out rapidly and reproducibly.

It will be appreciated that the holding clamp having one or more of the features described above can also be provided in an adapter device of the type described above.

In a further aspect there is provided a method for positioning at least one conductor of a cable to be measured, for example by means of an adapter device of the type described above, which method comprises the steps:

receiving part of the at least one conductor of the cable to be measured by means of a holding clamp, so that an end portion of the at least one conductor extends beyond the holding clamp;

clamping the at least one conductor by means of the holding clamp, whereby the conductor is fixed in its position and orientation relative to the holding clamp; and attaching the holding clamp to a receiving device, whereby the holding clamp is fixed in its position and orientation relative to the receiving device.

In a further development, the method can comprise at least one of the steps:

automatically cutting the end portion, extending beyond the holding clamp, of the at least one conductor received and clamped by the holding clamp to a predetermined length by means of a cutting tool of a cutting and stripping device; and automatically stripping a predetermined region of the end portion, extending beyond the holding clamp, of the at least one conductor received and clamped by the holding clamp by means of a stripping tool of the cutting and stripping device.

It will be appreciated that the subject-matter of the disclosure is not limited to the aspects, embodiments and further developments described above. The described features can be combined at will by the person skilled in the art without thereby departing from the subject-matter of the invention.

Exemplary embodiments will be explained in greater detail hereinbelow with reference to the accompanying schematic drawings, in which:

FIGS. 9A to 9I show an example of a cutting and stripping operation by means of a cutting and stripping device of the adapter device according to FIG. 4.

Figure 1:
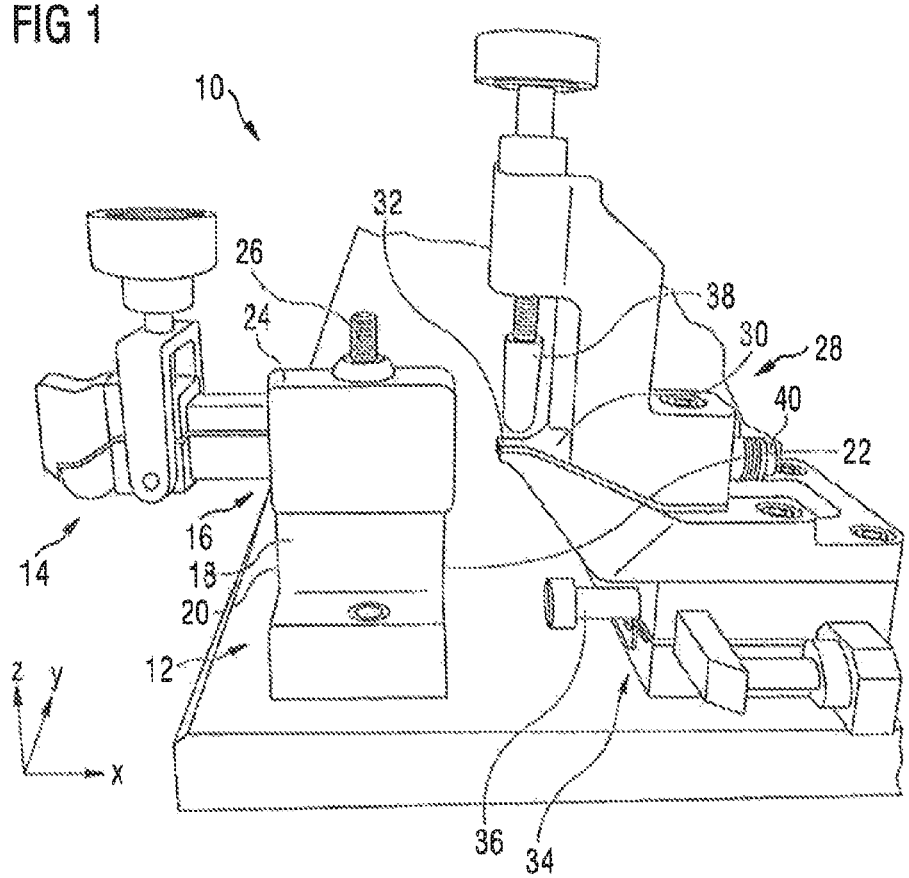
FIG. 1 shows an exemplary embodiment of the adapter device in a state at the start of attachment of a holding clamp to a receiving device.

FIG. 1 shows an adapter device 10 having a receiving device 12 and a holding clamp 14 which can be releasably attached to the receiving device 12. For attachment of the holding clamp 14 to the receiving device 12, the holding clamp 14 can be received in a receiving recess 16 of a receiving body 18 of the receiving device 12. In this exemplary embodiment, the receiving recess 16 extends from a lateral end face 20 of the receiving body 18 substantially horizontally through the receiving body to a further lateral end face 22 opposite the lateral end face 20. The receiving recess 16 thus forms a receiving opening (not shown in FIG. 1) at both end faces 20, 22. It will be appreciated that, in a further exemplary embodiment, the holding clamp can be fixedly attached to the receiving device. For example, the holding clamp can be connected to the receiving device and be displaceable relative thereto via a rail system.

In the example shown, the receiving body 18 of the receiving device 12 is fixedly connected to the support, for example via a screw or adhesive connection, whereby the receiving device 12 is fixed in its position and orientation. In a further example which is not shown, the receiving body can be connected to the support and be displaceable relative to the support via a rail system. On an upper surface 24 opposite the support, the receiving device 12 has a threaded screw 26 for fixedly connecting the receiving device 12, for example, to further components of the adapter device 10.

In the state shown in FIG. 1 at the start of the attachment of the holding clamp 14 to the receiving device 12, the holding clamp 14 is only partially received in the receiving recess 16 and thus not yet completely fixed in its position and orientation relative to the receiving device 12. In order to completely fix the position and orientation of the holding clamp 14 relative to the receiving device 12, the holding clamp 14 can be introduced further into the receiving recess 16 in the direction of the longitudinal axis of the holding clamp 14, or of the receiving recess 16.

Figure 2:
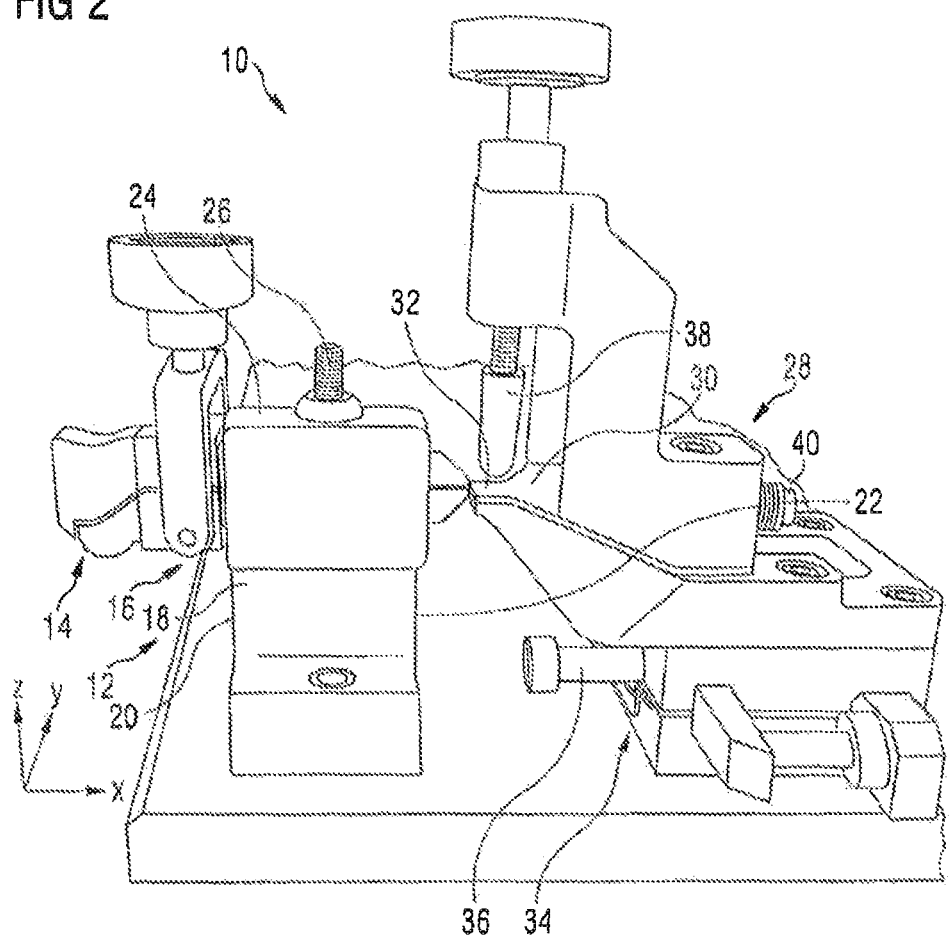
FIG. 2 shows the exemplary embodiment of the adapter device according to FIG. 1 in a state at the end of attachment of the holding clamp to the receiving device.

The state at the end of the attachment of the holding clamp 14 to the receiving device 12, in which the position and orientation of the holding clamp 14 relative to the receiving device 12 and thus relative to the support are fixed, is shown in FIG. 2. In this state, the holding clamp 14 extends through the receiving recess 16 of the receiving device 12, so that it projects beyond the receiving body at the two mutually opposite end faces 20, 22.

FIGS. 1 and 2 further show a measuring adapter 28 of the adapter device 10, which measuring adapter comprises a circuit board 30 having a contact region 32. The circuit board 30 is mounted on an X-Y table 34 of the measuring adapter 28. The position of the circuit board 30 and of the contact region 32 relative to the receiving device 12 can be precisely adjusted via micrometer screws 36. The measuring adapter 28 further comprises a plunger 38, which is arranged above the contact region 32 of the circuit board 30 to be displaceable in the vertical direction. The plunger 38 is fixedly connected to the circuit board 30 and the X-Y table 34 via a holding device 40 and is moved together with the circuit board 30 by adjustment of the micrometer screws 36. In other words, the plunger 38 is fixed in its orientation in the X- and Y-direction relative to the circuit board 30. In the Z-direction, the plunger 38 is manually displaceable relative to the circuit board 30, more precisely to the contact region 32. In order to carry out a measurement of a conductor (not shown in FIGS. 1 and 2), the measuring adapter 28 can be connected to a measuring instrument (not shown) via contact terminals 40.

It will be appreciated that, apart from the circuit board 30, all the components of the adapter device 10 that come into contact during operation with a conductor to be measured comprise a non-conductive material. In the exemplary embodiment shown, those components are capable of being produced by means of a rapid prototyping method.

In order to prepare at least one conductor to be measured (not shown in FIGS. 1 and 2) for a measurement, part of the conductor is received and clamped by means of the holding clamp 14. The receiving of a conductor to be measured is described in greater detail with reference to FIG. 8. The receiving and clamping of part of the conductor to be measured by means of the holding clamp 14 fixes the conductor in its position and orientation relative to the holding clamp 14. The conductor is thereby received by means of the holding clamp 14 in such a manner that an end portion of the conductor in a fully mounted state of the adapter device 10 extends beyond the holding clamp 14 in the direction towards the measuring adapter 28. The holding clamp 14 is attached to the receiving device 12 together with the conductor partially received therein. The position and orientation of the holding clamp 14 and thus of the conductor relative to the receiving device 12 are thereby fixed. The position of the circuit board 30 of the measuring adapter 28 is then adjusted by means of the micrometer screws 36, in dependence on the position of the conductor, in such a manner that the end portion of the conductor to be measured is located as accurately as possible above the contact region 32 of the circuit board 30. For contacting of the end portion of the conductor with the contact region 32 of the circuit board 30, the plunger 38 is actuated and displaced in the direction towards the contact region 32, whereby the end portion of the conductor is pressed onto the contact region 32. It can thereby be ensured that the conductor is conductively connected to the circuit board 30 and the connection that has been made is not accidentally released during the measurement.

The precise and reproducible fixing of the position and orientation of the conductor to be measured by means of the adapter device 10 and the establishment that is thereby possible of a secure conductive connection with a measuring instrument simplifies specimen preparation and allows reproducible measuring results to be obtained.

Figure 3:
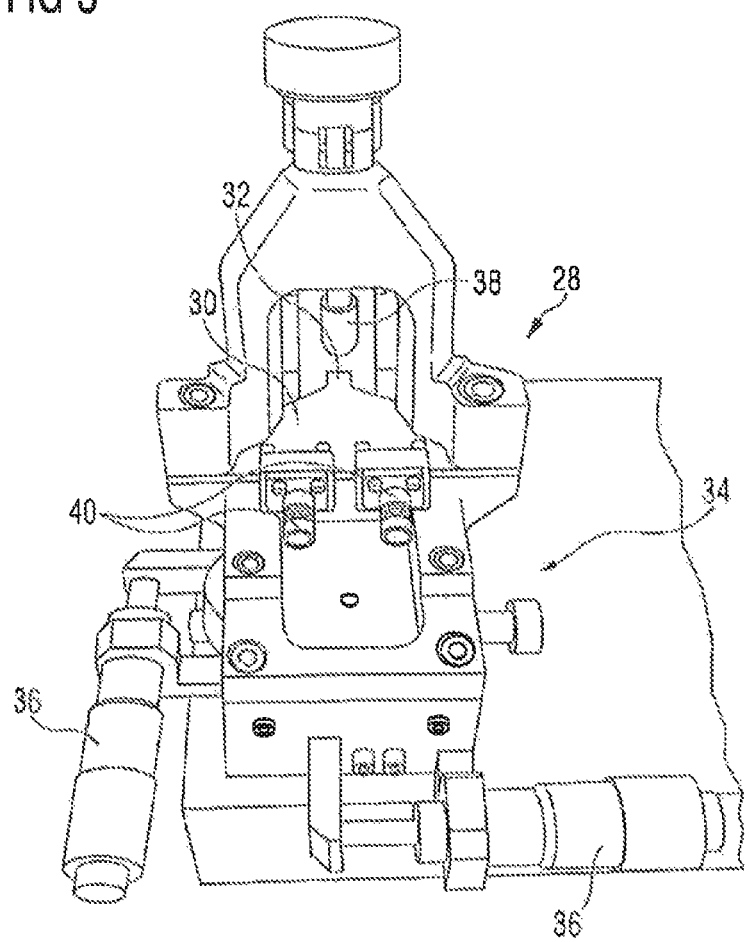
FIG. 3 is a further view of the exemplary embodiment of the adapter device according to FIG. 1.

FIG. 3 shows the adapter device according to FIGS. 1 and 2 in a further perspective view, in which the two micrometer screws 36 of the X-Y table 34 of the measuring adapter 28 can be seen. The two contact terminals 40 of the measuring adapter 28 for connecting the measuring adapter 28 to a measuring instrument are also shown in the representation according to FIG. 3.

Figure 4:
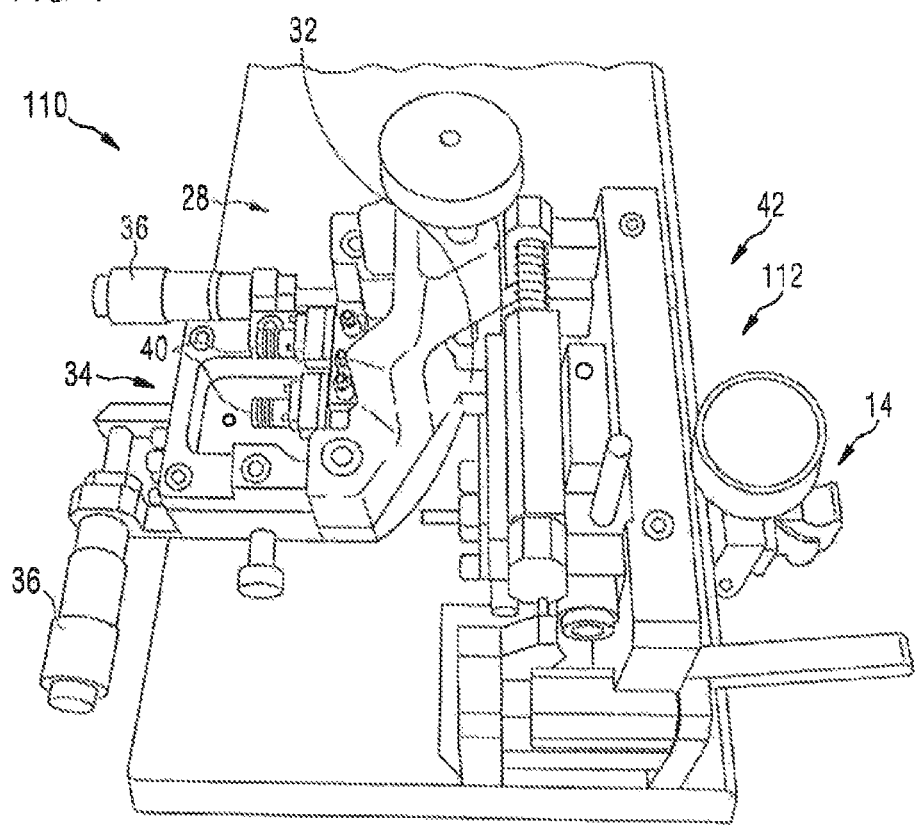
FIG. 4 shows a further exemplary embodiment of an adapter device having a cutting and stripping device.

FIG. 4 shows a further exemplary embodiment of an adapter device 110. The adapter device 110 according to FIG. 4 corresponds substantially to the adapter device 10 of FIGS. 1 to 3, for which reason components and features which are comparable or the same and have the same effect are provided with the same reference numerals as in the preceding figures. Thus, for example, the holding clamp and the measuring adapter of the adapter device according to FIG. 4 correspond to the corresponding components of FIGS. 1 to 3. Components and features that are not described again in relation to the further figures are similar in form and function to the corresponding components and features of the preceding figures.

In contrast to the adapter device 10 of FIGS. 1 to 3, the adapter device 110 of FIG. 4 additionally comprises a cutting and stripping device 42 which is fixedly connected to a receiving device 112 of the adapter device 110. More precisely, the receiving device 112 of the adapter device 110 is integrated into the cutting and stripping device 42. As is apparent from FIG. 4, the cutting and stripping device 42 is arranged between the holding clamp 14 and the measuring adapter 28. The position and orientation of the cutting and stripping device 42 relative to a base of the measuring adapter 28 is fixed in the example shown by a respective fixing of the cutting and stripping device 42 and of the measuring adapter 28 to the support. The cutting and stripping device 42 is adapted to cut to a predetermined length by means of a cutting tool (not shown in FIG. 4) an end portion, extending beyond the holding clamp 14, of a conductor (likewise not shown in FIG. 4) received and clamped by the holding clamp 14. The cutting and stripping device 42 further comprises a stripping tool (not shown in FIG. 4) which is configured to strip a predetermined region of the end portion, extending beyond the holding clamp 14, of the conductor to be measured. The operation of cutting and stripping is explained in greater detail hereinbelow with reference to FIGS. 9A-9I.

In this exemplary embodiment, the holding clamp 14 received in the receiving device of the adapter device 110 is displaceable relative to the cutting and stripping device 42 transversely to the longitudinal axis of the holding clamp 14 via the receiving device 112. For example, such displaceability can be achieved by means of a rail system (not shown in FIG. 4). In one example, such displaceability can be achieved by means of sliding surfaces formed on the holding clamp and the receiving device, or the cutting and stripping device. The orientation of the holding clamp 14 relative to the cutting and stripping device 42 is already fixed despite this displaceability by an introduction of the holding clamp 14 into the receiving device 112, while the position of the holding clamp 14 relative to the cutting and stripping device 42 is changeable by the displacement of the holding clamp 14. However, the holding clamp 14 can be fixed in different positions relative to the cutting and stripping device 42 in order also to fix the position of the holding clamp 14 relative to the cutting and stripping device 42. The displacement and fixed positioning of the holding clamp relative to the cutting and stripping device 42 permits reproducible stripping, cutting and positioning of a conductor to be measured, which is likewise explained in greater detail hereinbelow with reference to FIGS. 9A-9I.

Figure 5:
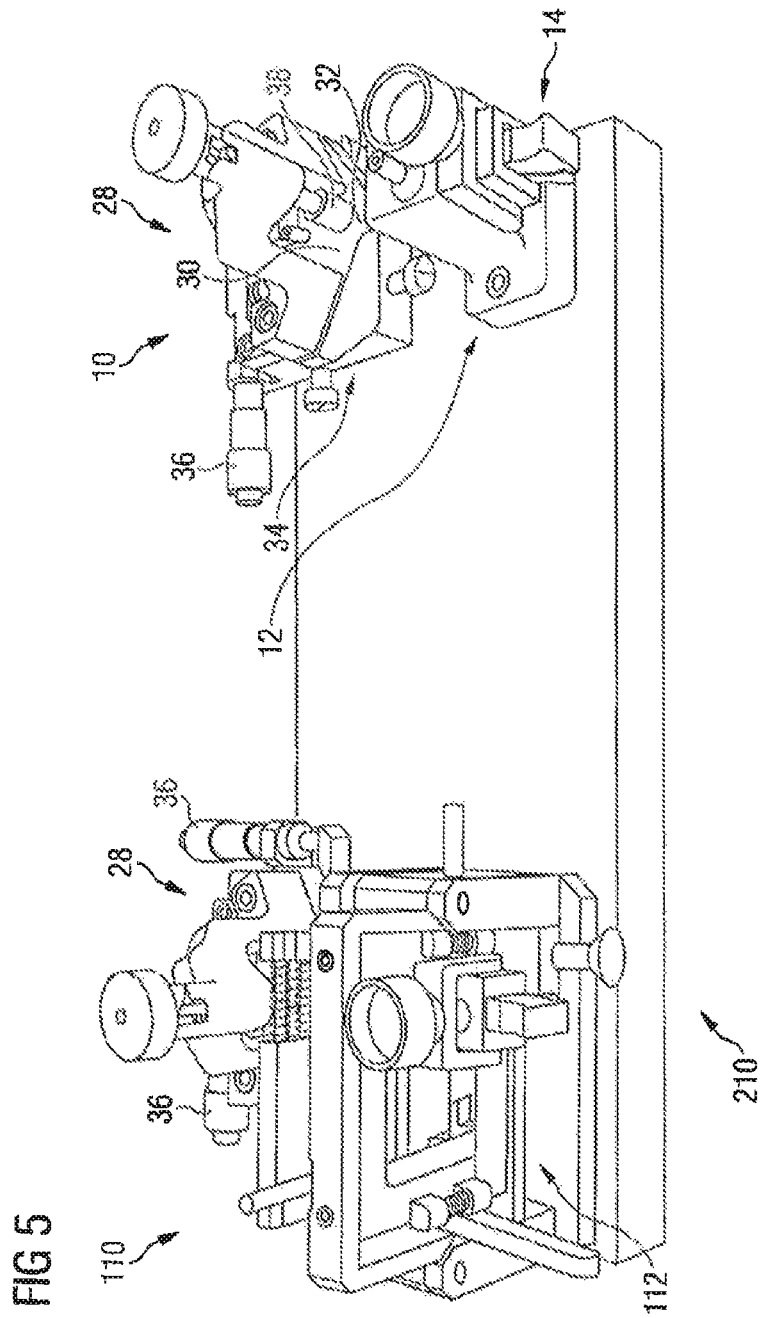
FIG. 5 shows a further exemplary embodiment of an adapter device for positioning both ends of a cable to be measured.

FIG. 5 shows a further embodiment of an adapter device 210 for positioning both ends of at least one conductor of a cable to be measured (not shown in FIG. 5), which adapter device is a combination of the adapter devices 10, 110 of FIGS. 1 and 4. In other words, the adapter device 210 constitutes an arrangement which comprises the adapter device 10 according to FIGS. 1 to 3 for positioning one end of the conductor and the adapter devices 110 according to FIG. 4 for positioning the other end of the conductor. It will be appreciated that, in further exemplary embodiments, it is possible to provide an adapter device for positioning both ends of at least one conductor of a cable to be measured that comprises two adapter devices according to FIGS. 1 to 3 or two adapter devices according to FIG. 4. A plurality of adapter devices of the type described above can also be provided in order to position a plurality of conductors of one or more cables to be measured.

Figure 6:
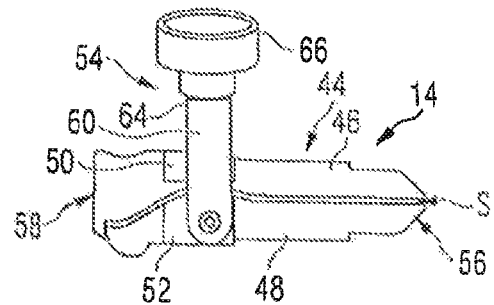
FIG. 6 is a side view of an exemplary embodiment of a holding clamp.
Figure 7:
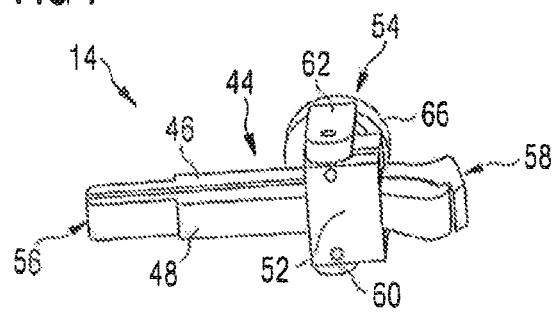
FIG. 7 is a bottom view of an exemplary embodiment of the holding clamp according to FIG. 6.

FIGS. 6 and 7 show an exemplary embodiment of the holding clamp 14 in a side view (FIG. 6) and a bottom view (FIG. 7). The holding clamp 14 has an elongate base body 44 with a first leg 46 and a second leg 48, The first and second legs 46, 48 extend in part substantially parallel to one another in the longitudinal direction of the holding clamp 14.

The base body 44, more precisely each of the two legs 46, 48, comprises an attachment portion 50, 52 which projects from the base body on both sides transversely to the longitudinal axis of the holding clamp 14, that is to say which has a greater width than the associated leg. The attachment portion 50, 52 serves to attach a force application mechanism 54 which is described in greater detail hereinbelow.

In a first region of the base body 44 extending from the attachment portions 50, 52 in the direction towards a first end 56 of the holding clamp 14, the two legs 46, 48 have a substantially constant height. In the first region, the outer surface of the base body 44 is in part complementary to an associated receiving device (not shown here) and has a rectangular shape in the exemplary embodiment shown.

In contrast to the first region, the first leg 46, in a second region of the base body 44 extending from the attachment portion 50 in the direction towards a second end 58 of the holding clamp 14, has an increasing height, the height enlargement of the first leg 46 extending substantially in the direction towards the second leg 48. The second leg 48 has a corresponding tapering in the second region of the base body 44, so that mutually facing surfaces of the first and second legs 46, 48 extend substantially parallel to one another also in the second region.

The first and second legs 46, 48 are spaced apart from one another slightly and thus form a gap 5, in order to receive between them part of at least one conductor to be measured (not shown in FIGS. 6 and 7). As a result of the enlarging height of the first leg 46 and the corresponding tapering of the second leg 48, the gap S has a curved profile in the second region. This is advantageous for the fixing of the conductor to be measured between the legs 46, 48.

In the embodiment shown, the two legs 46, 48 are displaceable relative to one another, whereby the size of the gap S can be made larger for receiving a conductor to be measured or made smaller for clamping the conductor to be measured. In order to make the gap S smaller and thereby clamp a conductor received between the legs 46, 48, the legs 46, 48 can be acted upon by means of the force application mechanism 54.

In the example shown, the force application mechanism 54 comprises a U-shaped stirrup with two mutually parallel stirrup legs 60, 62 and a stirrup crosspiece 64 connecting the stirrup legs 60, 62. The stirrup legs 60, 62 are each pivotably connected to the second leg 48, the first leg 46 being arranged between the stirrup crosspiece 64 and the second leg 48. The stirrup crosspiece 64 comprises a threaded bore (not shown) into which a screw 66 can be screwed in order to act in a force-applying manner on the first leg 46. By attaching the stirrup legs 60, 62 to the second leg 48 of the holding clamp 14 and applying force to the first leg 46 of the holding clamp 14, the two legs 46, 48 are moved towards one another or pressed together, whereby a conductor received between them is firmly clamped.

Figure 8:
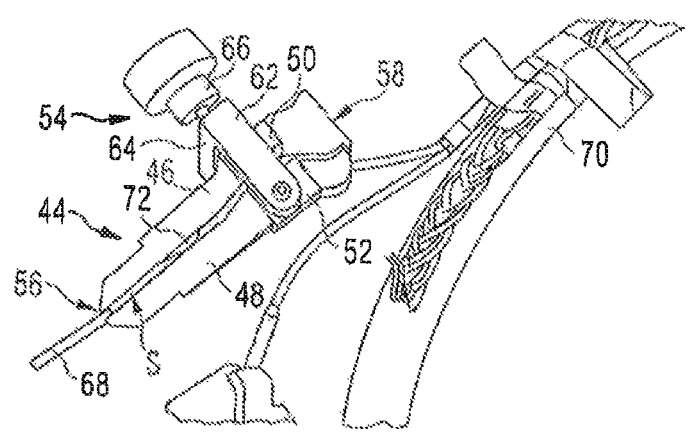
FIG. 8 is a side view of an exemplary embodiment of the holding clamp according to FIG. 6 with a conductor received and clamped therein.

FIG. 8 shows the holding clamp 14 according to FIGS. 6 and 7 with part of a conductor 68 of a cable 70 to be measured received and clamped therein.

For positioning by means of the holding clamp 14, the conductor 68 is introduced into the holding clamp 14 at the second end 58 thereof, is guided through the base body 44 of the holding clamp 14 along the gap S and emerges from the holding clamp 14 again at the first end 56 thereof. The force application mechanism 54 is then actuated by screwing in the screw 66. The conductor 68 is thus clamped between the two legs 46, 48, as described hereinbefore. As can be seen in FIG. 8, the first leg 46 has a projection 72 in the first region of the base body 44 on a surface facing the second leg 48, that is to say in the region of the gap S. The projection additionally facilitates the fixing or clamping of the conductor 68 between the legs 46, 48 of the holding clamp 14.

In an exemplary embodiment which is not shown, a portion of a rail system can be fastened to or formed on the holding clamp, via which portion the holding clamp can be attached to a complementary portion of the rail system provided on the receiving device.

FIGS. 9A to 9I show a cutting and stripping operation by means of the cutting and stripping device 42 of the adapter device 110 according to FIG. 4, which comprises a cutting tool 74 and a stripping tool 76. The cutting tool 74 and the stripping tool 76 are arranged adjacent to one another in a direction transverse to the longitudinal axis of the holding clamp 14.

The cutting tool 74 comprises two mutually opposite, movable cutting surfaces 78, 80 which in the exemplary embodiment shown are movable towards one another automatically in the direction indicated by the arrows 82, 84 in order to cut the end portion of the conductor 68 arranged between the cutting surfaces 78, 80 to a predetermined length. To that end, the conductor 68 to be measured, which is fixed in the holding clamp 14, is arranged in the receiving device of the cutting and stripping device 42 in the region of the cutting tool 74 by means of the holding clamp 14. The conductor 68 to be measured thereby extends between the cutting surfaces 78, 80 of the cutting tool 74, the conductor 68 being fixed in its position and orientation by the holding clamp 14.

The cutting surfaces 78, 80 are open, that is to say spaced apart from one another (see FIG. 9A), at the beginning of the cutting operation and on introduction of the conductor 68. For cutting the end portion of the conductor 68, the cutting tool 64 is actuated, whereby the cutting surfaces 78, 80 in the example shown are moved horizontally towards one another (see FIG. 9B). As can be seen from FIG. 9C, the cutting surfaces 78, 80 are offset slightly relative to one another in the direction of the longitudinal axis of the holding clamp 14, so that they slide past one another when the cutting tool 74 is fully actuated. The end portion of the conductor 68 extending between the cutting surfaces 78, 80 is thereby cut through. The length of the cut end portion of the conductor 68 then corresponds to the distance between the first end 56 of the holding clamp 14, at which the conductor 68 emerges from the holding clamp 14, and the cutting surfaces 78, 80 of the cutting tool 74. This distance can be variably adjustable in different embodiments of the adapter device, for example by adjusting and changing the position of the holding clamp, of the receiving device and/or of the cutting surfaces.

Figure 9D:
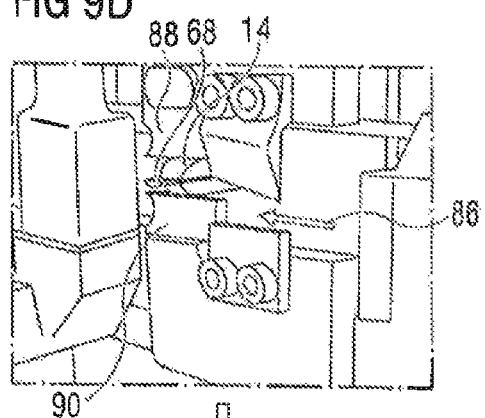

Following the cutting operation, the cutting tool 74 is opened by displacing the cutting surfaces 78, 80 in mutually opposite directions (see FIG. 9D). Furthermore, the conductor 68 is displaced by means of the holding clamp 14 in the direction indicated by the arrow 86 into the region of the stripping tool 76. The stripping tool 76 comprises two movable, mutually opposite stripping surfaces 88, 90 with cutting edges, which in the exemplary embodiment shown are movable towards one another automatically in the direction indicated by the arrows 92, 94 in order to strip the (cut) end portion of the conductor 68 arranged between the stripping surfaces 88, 90.

Figure 9E:
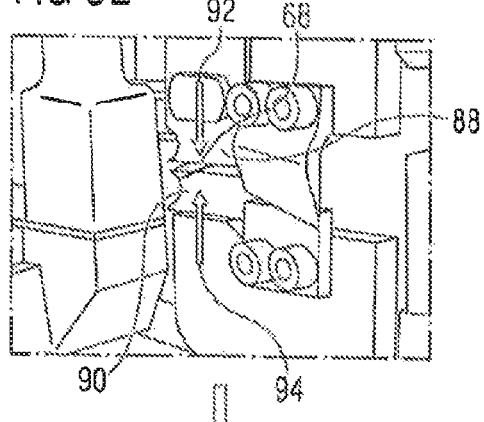
Figure 9F:
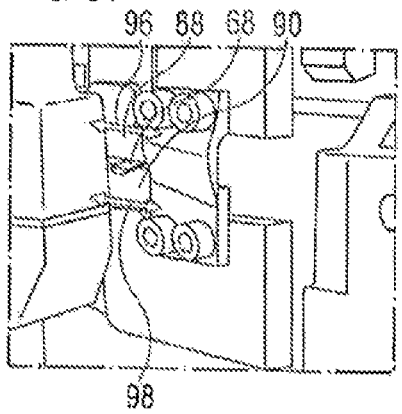

To that end, the stripping surfaces 88, 90 are first moved towards one another so that they are in contact with the end portion of the conductor 68 (see FIG. 9E). The stripping surfaces 88, 90 in contact with the end portion of the conductor 68 are then moved reciprocally at least once relative to the conductor 68 in FIG. 9F in a direction transversely to the direction of the longitudinal axis of the holding clamp 14 (see arrows 96, 98), whereby the insulation of the end portion of the conductor 68 is partly cut. The reciprocal relative movement between the stripping surfaces 88, 90 and the end portion of the conductor 68, or of the holding clamp 14, is achieved in the exemplary embodiment shown by a displacement of the entire cutting and stripping device 42 relative to the holding clamp 14. In further embodiments, however, it is possible to displace the stripping tool 76 for such a relative movement without the cutting tool 74, the stripping surfaces 88, 90 and/or the holding clamp 14.

Figure 9G:
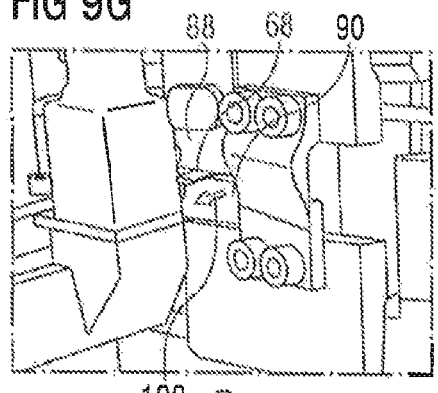

Following the cutting of the insulation of the end portion of the conductor 68, the stripping surfaces 88, 90, which are still in contact with the end portion of the conductor 68, are moved relative to the conductor 68 in a direction along the longitudinal axis of the holding clamp 14 (see arrow 100) (see FIG. 9G). A region of the insulation between the end of the end portion of the conductor 68 and the cut that has been made is then taken off or removed from the conductor 68. The length of the region of the end portion of the conductor 68 to be stripped then corresponds to the distance between the first end of the end portion of the conductor 68 and the cutting edges of the stripping surfaces 88, 90 of the stripping tool 76. That distance can be variably adjustable in different embodiments of the adapter device, for example by adjusting and changing the position of the holding clamp, of the receiving device and/or of the stripping surfaces.

Figure 9H:
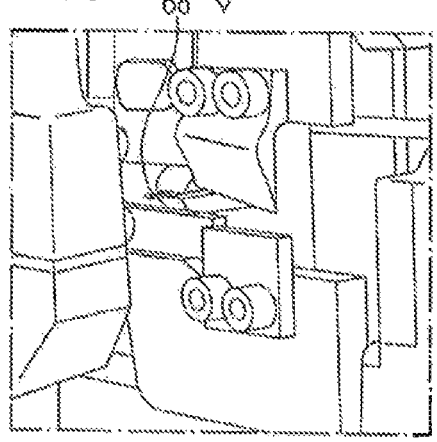

As can be seen in FIG. 9H, the stripping tool 76 is opened after the stripping operation by displacing the stripping surfaces 88, 90 in mutually opposite directions. The end portion, cut and stripped in a defined manner, of the conductor 68 is thus available for contacting with the circuit board of the measuring adapter.

Figure 9I:
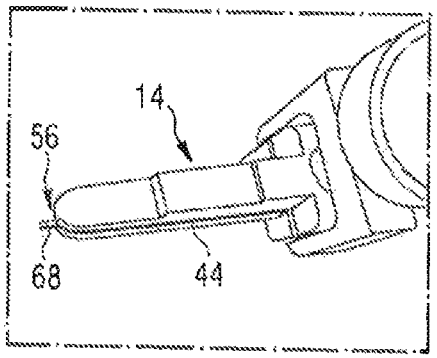

FIG. 9I shows a conductor 68 received and clamped in the holding clamp 14, which conductor has been cut and stripped as described above. By adjusting the above-described relative distances of the cutting tool, of the stripping tool and of the holding clamp, the length of the end portion of the conductor extending beyond the end of the holding clamp and the length of the stripped region of the end portion of the conductor can be adapted precisely and reproducibly as well as in an automated manner.

The invention claimed is:

1. An adapter device for positioning at least one conductor of a cable to be measured, which adapter device comprises:
a receiving device and a holding clamp which can be attached to the receiving device, wherein attaching the holding clamp to the receiving device fixes the holding clamp in its position and orientation relative to the receiving device, and wherein the holding clamp is configured to receive and clamp part of the at least one conductor of the cable to be measured in order to fix the conductor in its position and orientation relative to the holding clamp, so that an end portion of the at least one conductor extends beyond the holding clamp,
wherein the adapter device comprises a cutting and stripping device which is fixedly connected to the receiving device and wherein the receiving device is integrated into the cutting and stripping device, wherein the cutting and stripping device has a cutting tool which is configured to cut the end portion, extending beyond the holding clamp, of the at least one conductor received and clamped by the holding clamp to a predetermined length, and/or has a stripping tool which is configured to strip a predetermined region of the end portion, extending beyond the holding clamp, of the at least one conductor received and clamped by the holding clamp; and
wherein the holding clamp received in the receiving device is displaceable relative to the cutting and stripping device via the receiving device while the orientation of the holding clamp relative to the cutting and stripping device is fixed.

2. The adapter device as claimed in claim 1, wherein the holding clamp can be releasably attached to the receiving device.

3. The adapter device as claimed in claim 1, wherein the receiving device and the holding clamp have a mutually complementary shape at least in part, in order to attach the holding clamp to the receiving device in an interlocking manner.

4. The adapter device as claimed in claim 1, wherein the receiving device has a receiving body with a receiving recess through which the holding clamp extends in a state in which it is attached to the receiving device, so that the holding clamp projects beyond the receiving body on opposite sides of the receiving body.

5. The adapter device as claimed in claim 1, which further comprises a measuring adapter which can be connected to a measuring instrument, which measuring adapter comprises:
a circuit board having a contact region for contacting the end portion of the al least one conductor, and
a displaceable plunger which is configured, as a result of being actuated, to press the end portion of the al least one conductor onto the contact region of the circuit hoard.

6. The adapter device as claimed in claim 5, wherein the circuit board of the measuring adapter is mounted on an X-Y table with micrometer screws, and wherein the position of the circuit hoard relative to the end portion of the at least one conductor is adjustable by adjustment of the micrometer screws.

\* \* \* \* \*